United States Patent [19]

Hughes

[11] Patent Number: 4,858,069
[45] Date of Patent: Aug. 15, 1989

[54] ELECTRONIC HOUSING FOR A SATELLITE EARTH STATION

[75] Inventor: Paul R. Hughes, Sudbury, Mass.

[73] Assignee: GTE Spacenet Corporation, Waltham, Mass.

[21] Appl. No.: 229,944

[22] Filed: Aug. 8, 1988

[51] Int. Cl.$^4$ .............................................. H05K 7/20
[52] U.S. Cl. .................................. 361/384; 165/80.3; 165/104.33; 174/15.1; 174/16.1; 361/386; 361/390
[58] Field of Search ............. 165/86.3, 104.33, 104.34; 174/15.1, 16 HS, 16 R; 361/381, 383–389, 390; 98/58

[56] References Cited

U.S. PATENT DOCUMENTS

| | | | |
|---|---|---|---|
| 2,471,011 | 5/1949 | Shapiro | 361/381 |
| 3,317,798 | 5/1967 | Chu et al. | 361/384 |
| 3,396,780 | 8/1968 | Koltuniak et al. | 361/384 |
| 3,462,553 | 8/1969 | Spranger | 361/383 |
| 3,710,193 | 1/1973 | Greenberg et al. | 361/388 |
| 3,744,559 | 7/1973 | Overholt | 165/80.3 |
| 3,749,981 | 7/1973 | Koltaniak et al. | 361/384 |
| 3,912,001 | 10/1975 | Missman et al. | 165/80.4 |
| 3,940,665 | 2/1976 | Seki | 361/383 |
| 4,535,386 | 8/1985 | Frey, Jr. et al. | 361/389 |
| 4,644,443 | 2/1987 | Swensen et al. | 361/384 |

Primary Examiner—A. D. Pellinen
Assistant Examiner—Gregory D. Thompson
Attorney, Agent, or Firm—Ivan L. Ericson

[57] ABSTRACT

A compact electronic housing for a satellite earth station is described. The compact electronic housing comprises a first compartment and a second compartment separated by a panel common to both compartments. The first compartment contains electronic components and is atmospherically isolated from outside air and the second compartment. The electronic components comprise a plurality of groupings. The second compartment provides for movement of outside air into the second compartment through a bottom opening and out a top opening by a chimney effect cooling a plurality of heat exchangers. The panel dividing the two compartments comprises a plurality of conductive heat transferring elements for transferring heat from the electronic components to the plurality of heat exchanger element. The plurality of conductive heat transferring elements are thermally insulated from each other by an insulating material; thereby, maintaining a temperature differential between the groups of electronic components even though there is a close physical proximity between the groups. The electronic components are connected to one side of the conductive heat transferring elements and the heat exchanger elements are connected to the other side of the conductive heat transferring elements. The electronic components having the greatest heat generating capacity and/or highest allowable operating temperature are physically separated and/or located above the other electronic components.

28 Claims, 4 Drawing Sheets

ELECTRONIC HOUSING FOR A SATELLITE EARTH STATION

FIELD OF THE INVENTION

This invention relates to a housing for the electronics of a satellite earth station. More particularly, this invention relates to a compact electronic housing for a satellite earth station having a means for removing heat generated by the electronic components within the housing.

BACKGROUND OF THE INVENTION

Earth stations for satellite communications typically contain an antenna and a facility for housing the electronics for the communications system. To protect the electronics from the environment, they are usually contained in a building which has the capability of maintaining the electronics at proper operating temperatures which requires an air conditioning system with a filtered air supply.

The satellite earth stations have to withstand a wide range of environmental conditions which are found throughout the world, such as jungles, deserts, and mountain peaks. There is an increasing need for remote compact earth stations which are cost effective, powerful, and easy to install and maintain. When the earth stations are used in remote, non-accessible areas, it is important that they endure long periods of trouble free operation.

SUMMARY OF THE INVENTION

In accordance with one aspect of the present invention, a new and improved compact electronic housing for a satellite earth station comprises a first compartment and a second compartment separated by a panel common to the first compartment and the second compartment.

The first compartment is atmospherically isolated from outside air and the second compartment. The first compartment has a top inside surface and an access means for accessing electronic components contained therein.

The electronic components comprise a first group of electronic components, a second group of electronic components, a third group of electronic components, and a fourth group of electronic components. The first group of electronic components generates more heat and/or tolerates a higher operating temperature than the other groups of electronic components and is located above the second and third groups of electronic components. The third group of electronic components generates less heat and/or tolerates a lower maximum operating temperature than the first group and second group of electronic components and is located below the other groups of electronic components. The fourth group of electronic components has a lower maximum operating temperature than the first, second, and third groups of electronic components.

The second compartment contains a plurality of heat exchanger means for transferring heat from the electronic components to the outside air. The plurality of heat exchanger means comprise a first heat exchanger means, a second heat exchanger means, a third heat exchanger means, and a fifth heat exchanger means.

The second compartment has a bottom opening and a top opening to provide for movement of outside air caused by a chimney effect within the second compartment. The outside air enters the second compartment through the bottom opening, contacts and cools the plurality of heat exchanger means, then exits the second compartment through the top opening.

The panel comprises a plurality of conductive heat transferring means for transferring heat from the electronic components and a fourth heat exchanger means contained in the first compartment to the plurality of heat exchanger means contained in the second compartment. The plurality of conductive heat transferring means each has a first side and a second side.

The first group of electronic components is connected to the first side of the first conductive heat transferring means and the first heat exchanger means is connected to the second side of the first conductive heat transferring means opposite the first group of electronic components. The second group of electronic components is connected to the first side of the second conductive heat transferring means and the second heat exchanger means is connected to the second side of the second conductive heat transferring means opposite the second group of electronic components. The third group of electronic components is connected to the first side of the third conductive heat transferring means and the third heat exchanger means is connected to the second side of the third conductive heat transferring means opposite the third group of electronic components. The fourth group of electronic components is connected to the top inside surface of the first compartment and isolated from the first conductive heat transferring means.

The first conductive heat transferring means is adjacent to and above the second conductive heat transferring means. The second conductive heat transferring means is isolated by a thermally insulating material from the first conductive heat transferring means which has the first group of electronic components connected thereto. The second conductive heat transferring means is adjacent to and above the third conductive heat transferring means. The third conductive heat transferring means is isolated by a thermally insulating material from the second conductive heat transferring means which has the second group of electronic components connected thereto. The third conductive heat transferring means is adjacent to and above the fourth conductive heat transferring means. The fourth conductive heat transferring means is isolated by an insulating material from the third conductive heat transferring means which has the third group of electronic components connected thereto.

The first compartment contains an air moving means for removing convective heat generated by the electronic components. The air moving means is adapted to conveying air by recycling the air within the first compartment by contacting the air to the fourth heat exchanger means connected to the first side of the fourth conductive heat transferring means, cooling the air, conveying the air after contacting said fourth heat exchanger means to the fourth group of electronic components, to the first group of electronic components, to the second group of electronic components, to the third group of electronic components, and back to the air moving means.

For a better understanding of the present invention, together with other and further objects, advantages and capacities thereof, reference is made to the following disclosure and appended claims in accordance with the above identified drawing.

DETAILED DESCRIPTION OF THE INVENTION

The present invention relates to a compact electronic housing of an earth station containing components for communications via an antenna that is directed to a satellite; however, the present invention is not necessarily limited to an electronic housing of an earth station.

The earth station includes a compact electronic housing which is divided into a first compartment and a second compartment by a panel. Electronic equipment is housed within the first compartment of the housing and mounted on plates which are supported by the panel dividing the housing into two compartments or mounted to the panel. The electronic equipment that generates the least heat and/or must be kept coolest is mounted near the bottom of the compartment, or provisions made to keep it cool if not located at the bottom of the compartment. The electronic equipment that tends to generate the most heat and tolerates the highest maximum operating temperature is mounted at the top of the compartment. Thus, the electronic equipment which generates the most heat does not tend to heat the electronic equipment that generates less heat. The electronic equipment mounted on the plates or the panel in the first compartment are coupled through the panel to heat exchanger means which are mounted in the second compartment on the opposite side of the panel dividing the housing. The individual plates are physically separated from each other to thermally isolate the electronic equipment mounted on each plate from the electronic equipment mounted on the other plates; thereby, maintaining a temperature differential between the electronic equipment mounted on one plate from the electronic equipment mounted on adjacent plates even though there is a close physical proximity between the electronic equipment.

The second compartment of the compact electronic housing is substantially enclosed except for air openings near the top and bottom to create a chimney effect. Outside air flows by convection from the bottom air opening through the top opening to cool the heat exchanger means mounted on the panel in the second compartment of the electronic housing.

Figure 1:
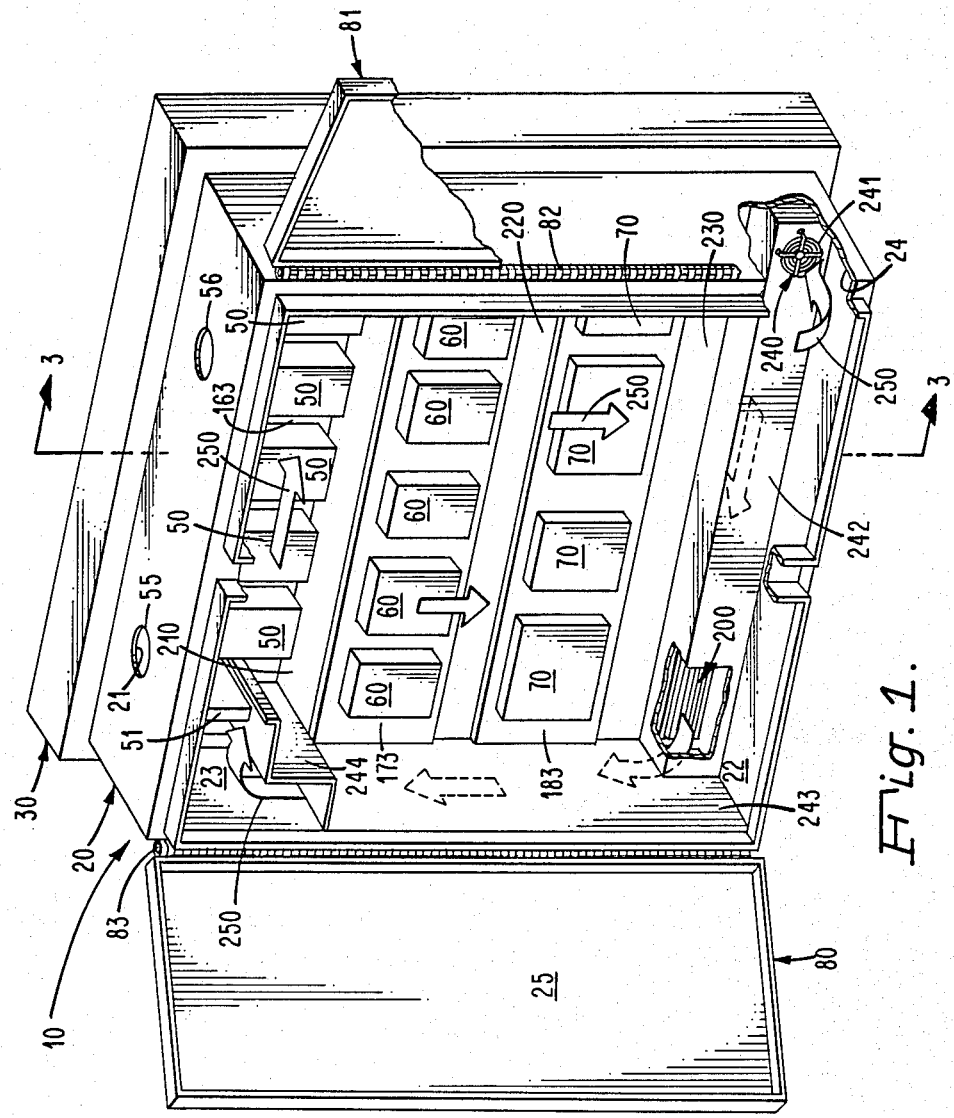
FIG. 1 is a partial cutaway perspective front view of an electronic housing in accordance with the present invention.
Figure 2:
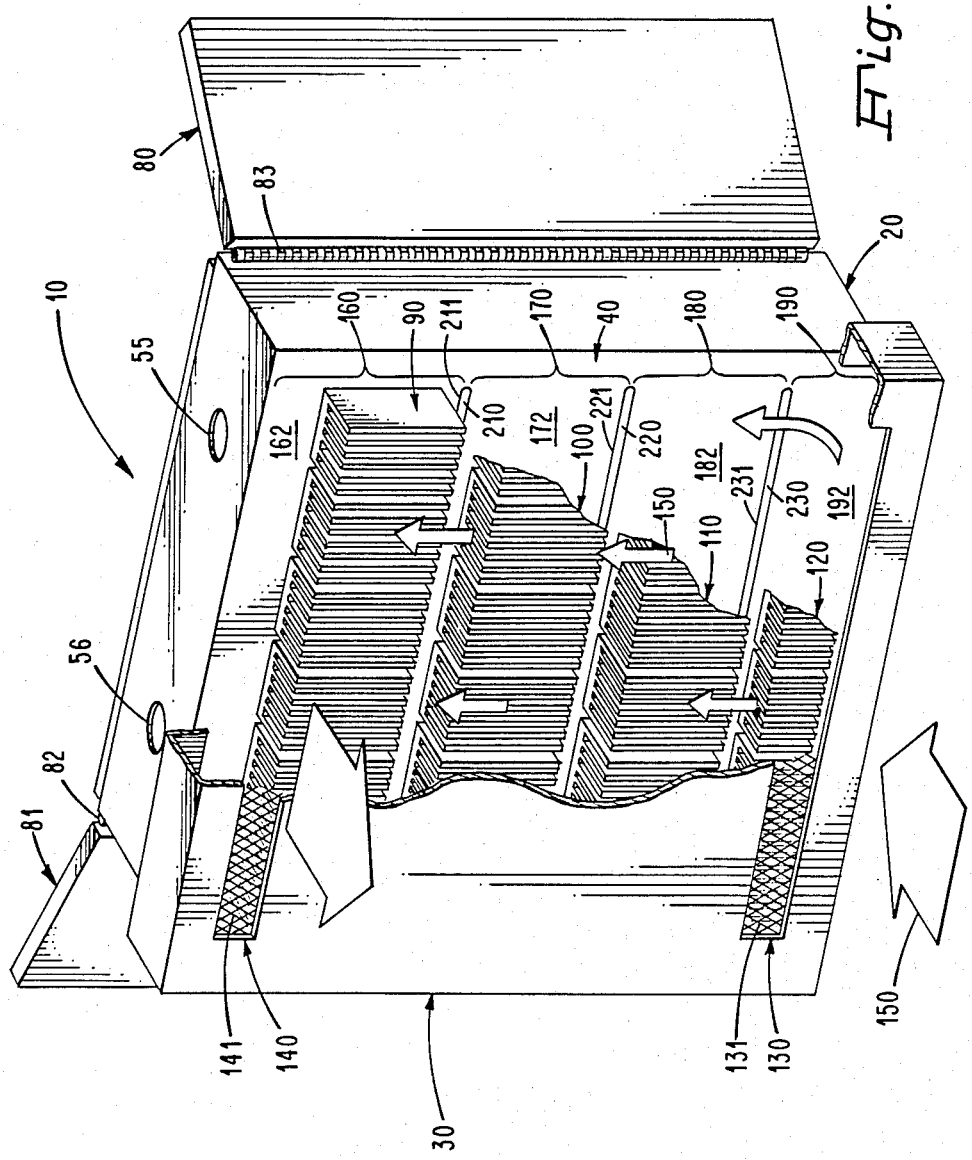
FIG. 2 is a partial cutaway perspective rear view of the electronic housing shown in FIG. 1 in accordance with the present invention.
Figure 3:
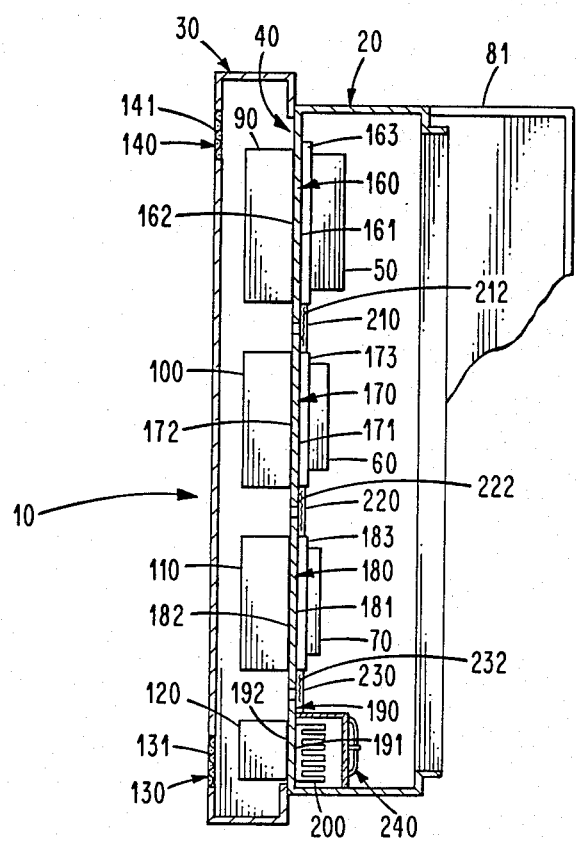
FIG. 3 is a cross-sectional view along line 3—3 of FIG. 1 in accordance with the present invention.

Referring now to the drawing with greater particularity, there is shown in FIG. 1 a compact electronic housing 10 for a satellite earth station comprises first compartment 20 and second compartment 30 separated by panel 40, shown in FIG. 2 and 3, common to first compartment 20 and second compartment 30. Compact electronic housing 10 has limited volume within first compartment 20. The dimensions of first compartment 20 is approximately 4'×5'×13" and the overall dimensions of compact electronic housing 10 is approximately 4'×5'×1½'.

First compartment 20 is atmospherically isolated from outside air 150 and second compartment 30 shown in FIG. 2. First compartment 20 has access means, such as doors 80 and 81 which have corresponding hinges 83 and 82, for accessing first group of electronic components 50, second group of electronic components 60, third group of electronic components 70, and fourth group of electronic components 51 contained in first compartment 20. First compartment 20 has a top inside surface 21, a bottom inside surface 22, two side inside surfaces 23 and 24, a front inside surface 25 and a back inside surface comprising first side 161 of first conductive heat transferring means 160, first side 171 of second conductive heat transferring means 170, first side 181 of third conductive heat transferring means 180, and first side 191 of fourth conductive heat transferring means 190. First compartment 20 has ports 55 and 56 located at the top of compartment 20 for interfacing a satellite antenna to compact electronic housing 10. Ports 55 and 56 are adapted to maintain first compartment 20 atmospherically isolated from outside air 150. First group of electronic components 50 comprise electronic components such as high power amplifiers (HPA). First group of electronic components 50 have a maximum allowable base plate temperature as high as 105° C. and a maximum heat load of 1000 W. Second group of electronic components 60, such as power supplies have a maximum allowable base plate temperature of 75° C. and a maximum heat load of 500 W. Third group of electronic components 70, such as a local oscillator, a converter, a synthesizer, has a maximum allowable base plate temperature of 65° C. and a maximum heat load of 250 W, and fourth group of electronic components 51 comprise electronic components such as low noise amplifiers (LNAs) and a waveguide switching module. Fourth group of electronic components 51 represent a group of low temperature limit devices which should be kept at a temperature below 60° C. which is lower than the third group of electronic components. The LNAs of fourth group of electronic components 51 are not located below third group of electronic components 70 of first compartment 20 where the temperature would be cooler since the waveguide run between the LNAs and the antenna must be kept at a minimum length. Therefore, the LNAs of fourth group of electronic components 51 are located at the top of first compartment 20 at port 55 and are connected to top inside surface 21 of first compartment 20 and are provided with a means to maintain their temperature below 60° C. Fourth group of electronic components 51 themselves dissipate very little power. For example, the LNAs dissipate only 2 watts each.

The environmental operational range of conditions for the electronic housing is from −20° C. to +50° C., up to an altitude of 10,000 feet, and a relative humidity from 0 to 100%. The electronic housing can be made from any structural material, such as aluminum, copper or steel, which can withstand the outside environment encountered in jungles, deserts, and mountain peaks.

Shown in FIG. 2 second compartment 30 contains first heat exchanger means 90, second heat exchanger means 100, and third heat exchanger means 110 for transferring heat from first group of electronic components 50, second group of electronic components 60, and third group of electronic components 70 to the outside air 150 and fifth heat exchanger means 120 for transferring heat from fourth heat exchanger means 200 located in first compartment 20 to outside air 150.

Heat exchanger means 90, 100, 110, 120, and 200 comprise heat exchangers having fins for air cooling.

Second compartment 30 has bottom opening 130 with screening 131 and top opening 140 with screening 141 to provide for movement of outside air 150 caused by a chimney effect within second compartment 30. Outside air 150 enters second compartment 30 through bottom opening 130 contacting fifth heat exchanger means 120, third heat exchanger means 110, second heat exchanger means 100, and first heat exchanger means 90 then exits second compartment 30 through top opening 140.

Shown in FIGS. 2 and 3, panel 40 comprises first conductive heat transferring means 160 having a first side 161 and a second side 162, second conductive heat transferring means 170 having a first side 171 and a second side 172, third conductive heat transferring means 180 having a first side 181 and a second side 182, and fourth conductive heat transferring means 190 having a first side 191 and a second side 192. Panel 40 is made from a heat conductive structural material such aluminum, copper, or steel. Alternatively, panel 40 can be constructed as part of the basic enclosure creating compartment 20.

First group of electronic components 50 is connected to first heat distribution plate 163 which is connected to first side 161 of first conductive heat transferring means 160 and first heat exchanger means 90 is connected to second side 162 of first conductive heat transferring means 160 opposite first group of electronic components 50. Second group of electronic components 60 is connected to second heat distribution plate 173 which is connected to first side 171 of second conductive heat transferring means 170 and second heat exchanger means 100 is connected to second side 172 of second conductive heat transferring means 170 opposite second group of electronic components 60. Third group of electronic components 70 is connected to third heat distribution plate 183 which is connected to first side 181 of third conductive heat transferring means 180 and third heat exchanger means 110 is connected to second side 182 of third conductive heat transferring means 180 opposite third group of electronic components 70. Fourth heat exchanger means 200 is connected to first side 191 of fourth conductive heat transferring means 190 and fifth heat exchanger means 120 is connected to second side 192 of fourth conductive heat transferring means 190 opposite fourth heat exchanger means 200.

Heat generated by first group of electronic components 50 is conducted from first heat distribution plate 163 to first conductive heat transferring means 160 to first heat exchanger means 90 and transferred to outside air 150.

Heat generated by second group of electronic components 60 is conducted from second heat distribution plate 173 to second conductive heat transferring means 170 to second heat exchanger means 100 and transferred to outside air 150.

Heat generated by third group of electronic components 70 is conducted from third heat distribution plate 183 to third conductive heat transferring means 180 to third heat exchanger means 110 and transferred to outside air 150.

Heat from recycled air 250 contained in first compartment 20 is transferred to fourth heat exchanger 200, conducted from fourth heat exchanger 200 to fourth conductive heat transferring means 190 to fifth heat exchanger 120 and transferred to outside air 150.

First conductive heat transferring means 160 is adjacent to and essentially thermal conductively insulated from second conductive heat transferring means 170 by insulating material 210. Second conductive heat transferring means 170 is adjacent to and essentially thermal conductively insulated from third conductive heat transferring means 180 by insulating material 220, and third conductive heat transferring means 180 is adjacent to and essentially thermal conductively insulated from fourth conductive heat transferring means 190 by insulating material 230.

Insulating material 210, 220, and 230 is a solid material, such as a silicone sealant, which provides a high thermal resistance and an effective environmental seal between first compartment 20 and second compartment 30 when incorporated into slots, 211, 221, and 231 in panel 40 shown in FIG. 1. Slots 211, 221, and 231 filled with insulating material 210, 220, and 230 respectively separate first conductive transferring means 160 from second conductive transferring means 170 from third conductive transferring means 180 from fourth conductive transferring means 190. Insulating material 210, 220, and 230 is resistant to degradation by moisture, fungus, temperatures to 110° C., and sunlight, and it has sufficient elasticity to allow for relative movement of segments of panel 40 caused by temperature differences such as expansion and contraction. The expansion and contraction can cause panel 40 to bow inward and outward as a result of the temperature differences.

Figure 4:
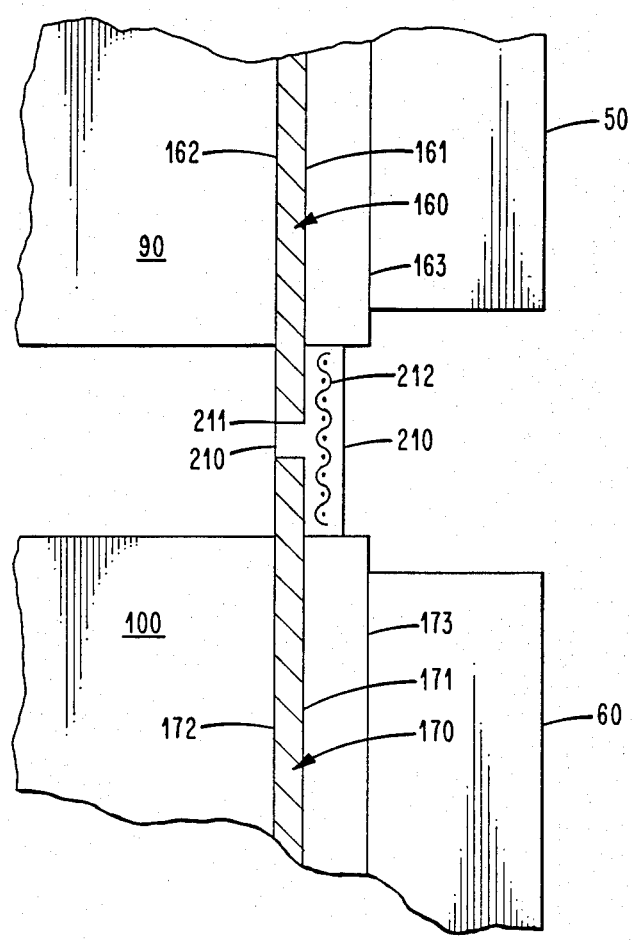
FIG. 4 is an enlarged partial portion of the cross-sectional view along 3—3 of FIG. 1 in accordance with the present invention.

Screening material 212, 222, and 232, such as nylon or polyester screening, shown in FIG. 3 and 4, is embedded into insulating material 210, 220, and 230 respectively to provide more resistance to punctures of the insulating material which could compromise the environmental seal.

First conductive heat transferring means 160 is located above second conductive heat transferring means 170. Second conductive heat transferring means 170 is located above third conductive heat transferring means 180, and the third conductive heat transferring means 180 is located above fourth conductive heat transferring means 190.

First compartment 20 contains air moving means 240 for removing convective heat generated by the electronic components contained in first compartment 20. Air moving means 240 is adapted to convey air 250 within first compartment 20 through horizontal duct 242 contacting air 250 to fourth heat exchanger means 200 attached to first side 191 of fourth conductive heat transferring means 190, conveying air 250 after contacting fourth heat exchanger means 200 through vertical duct 243 and deflector 244 then contacting and cooling fourth group of electronic components 51 before contacting first group of electronic components 50, then contacting second group of electronic components 60, then third group of electronic components 70, and back to air moving means 240. Air moving means 240 comprises electric fan 241, horizontal duct 242, vertical duct 243, and deflector 244 for directing air 250 to the groups of electronic components 51, 50, 60, and 70.

The new and improved compact electronic housing provides a flexible packaging based upon modular components providing unparalleled versatility and efficient small quantity customized production.

The new and improved compact electronic housing provides a compact size which eliminates the need for large, costly equipment shelters, reduces installation time and effort, and lessens the environmental impact and minimizes customer maintenance.

The unique passive cooling system of the new and improved compact electronic housing eliminates the need for air conditioning, lowers the operating cost and increases system reliability, and the new and improved compact electronic housing provides easy access to electronics which means replacements and/or repairs are made quickly and easily.

While there has been shown and described what is at present considered the preferred embodiment of the invention, it will be obvious to those skilled in the art that various changes and modifications may be made therein without departing from the scope of the invention as defined by the appended claims.

What is claimed is:

1. A compact electronic housing for a satellite earth station comprising a first compartment and a second compartment separated by a panel common to said first compartment and said second compartment;

said first compartment being atmospherically isolated from outside air and said second compartment, said first compartment having a top inside surface and an access means for accessing electronic components contained therein;

said electronic components comprising a first group of electronic components, a second group of electronic components, a third group of electronic components, and a fourth group of electronic components;

said first group of electronic components generating more heat and/or tolerating a higher maximum operating temperature than said second group of electronic components, said third group of electronic components, and said fourth group of electronic components, said first group of electronic components being located above said second group of electronic components and said third group of electronic components;

said third group of electronic components generating less heat and/or tolerating a lower maximum operating temperature than said first group of electronic components and said second group of electronic components, said third group of electronic components being located below said first group of electronic components, said second group of electronic components, and said fourth group of electronic components;

said fourth group of electronic components having a lower maximum operating temperature than said first, second, and third groups of electronic components;

said second compartment containing a plurality of heat exchanger means for transferring heat from said electronic components to said outside air, said plurality of heat exchanger means comprising a first heat exchanger means, a second heat exchanger means, a third heat exchanger means, and a fifth heat exchanger means;

said second compartment having a bottom opening and a top opening to provide for movement of outside air causing a chimney effect within said second compartment, said outside air entering said second compartment through said bottom opening, contacting and cooling said plurality of heat exchanger means and exiting said second compartment through said top opening;

said panel comprising a first, second , and third conductive heat transferring means for transferring heat from said electronic components and a fourth conductive heat transferring means for transferring heat from a fourth heat exchanger means contained in said first compartment to said plurality of heat exchanger means contained in said second compartment, said first, second, third, and fourth conductive heat transferring means each having a first side and a second side;

said first group of electronic components being connected to said first side of said first conductive heat transferring means and said first, heat exchanger means being connected to said second side of said first conductive heat transferring means opposite said first group of electronic components, said second group of electronic components being connected to said first side of said second conductive heat transferring means and said second heat exchanger means being connected to said second side of said second conductive heat transferring means opposite said second group of electronic components, said third group of electronic components being connected to said first side of said third conductive heat transferring means and said third heat exchanger means being connected to said second side of said third conductive heat transferring means opposite said third group of electronic components, said fourth group of electronic components being connected to said top inside surface of said first compartment and being isolated from said first conductive heat transferring means;

said first conductive heat transferring means being adjacent to and above said second conductive heat transferring means, said second conductive heat transferring means being insulated by an insulating material from said first conductive heat transferring means having said first group of electronic components being connected thereto, said second conductive heat transferring means being adjacent to and above said third conductive heat transferring means, said third conductive heat transferring means being insulated by an insulating material from said second conductive heat transferring means having said second group of electronic components being connected thereto, said third conductive heat transferring means being adjacent to and above said fourth conductive heat transferring means, said fourth conductive heat transferring means being insulated by an insulating material from said third conductive heat transferring means having said third group of electronic components being connected thereto; and said first compartment containing an air moving means for removing convective heat generated by said groups of electronic components, said air moving means being adapted to conveying air by recycling said air within said first compartment by contacting said air to said fourth heat exchanger means connected to said first side of said fourth conductive heat transferring means, cooling said air, conveying said air after contacting said fourth heat exchanger means to said fourth group of electronic components, to said first group of electronic components, to said second group of electronic components, to said third group of electronic components, and back to said air moving means.

2. A compact electronic housing for a satellite earth station in accordance with claim 1 wherein said panel comprises a metal panel having horizontal slots separating said first conductive heat transferring means from said second conductive heat transferring means from said third conductive heat transferring means from said fourth conductive heat transferring means.

3. A compact electronic housing for a satellite earth station in accordance with claim 1 wherein said insulating material is a solid material having a high thermal resistance, providing an effective environmental seal between said first compartment and said second compartment, and being incorporated in slots contained in said panel.

4. A compact electronic housing for a satellite earth station in accordance with claim 1 wherein said insulating material is a silicone sealant.

5. A compact electronic housing for a satellite earth station in accordance with claim 1 wherein said air moving means comprises an electric fan, horizontal ductwork, vertical ductwork, and a deflector.

6. A compact electronic housing for a satellite earth station in accordance with claim 1 wherein said insulating material has screening material embedded therein.

7. A compact electronic housing for a satellite earth station in accordance with claim 1 wherein said electronic housing is made from structural material, such as aluminum, copper or steel which can withstand outside environment encountered in jungles, deserts, and mountain peaks.

8. A compact electronic housing for a satellite earth station in accordance with claim 1 wherein said compact electronic housing has an environmental operational range from $-20°$ C. to $+50°$ C., up to an altitude of 10,000 feet, and a relative humidity from 0 to 100%.

9. A compact electronic housing for a satellite earth station in accordance with claim 1 wherein said plurality of heat exchanger means comprise heat exchangers having air cooling fins.

10. A compact electronic housing for a satellite earth station in accordance with claim 1 wherein said first group of electronic components have a maximum allowable base plate temperature of 105° C. and a maximum heat load of 1000 W.

11. A compact electronic housing for a satellite earth station in accordance with claim 1 wherein said second group of electronic components have a maximum allowable base plate temperature of 75° C. and a maximum heat load of 500 W.

12. A compact electronic housing for a satellite earth station in accordance with claim 1 wherein said third group of electronic components have a maximum allowable base plate temperature of 65° C. and a maximum heat load of 250 W.

13. A compact electronic housing for a satellite earth station in accordance with claim 1 wherein said electronic housing comprises a compact electronic housing having overall dimensions of approximately $4' \times 5' \times 1\frac{1}{2}'$.

14. A compact electronic housing for a satellite earth station in accordance with claim 1 wherein said first compartment has dimensions of approximately $4' \times 5' \times 13''$.

15. A compact electronic housing for a satellite earth station comprising a first compartment and a second compartment separated by a panel common to said first compartment and said second compartment;

said first compartment being atmospherically isolated from outside air and said second compartment, said first compartment having a top inside surface and an access means for accessing electronic components contained therein;

said electronic components comprising a first group of electronic components, a second group of electronic components, a third group of electronic components, and a fourth group of electronic components;

said first group of electronic components generating more heat and/or tolerating a higher maximum operating temperature than said second group of electronic components, said third group of electronic components, and said fourth group of electronic components, said first group of electronic components being located above said second group of electronic components and said third group of electronic components;

said third group of electronic components generating less heat and/or tolerating a lower maximum operating temperature than said first group of electronic components and said second group of electronic components, said third group of electronic components being located below said first group of electronic components, said second group of electronic components, and said fourth group of electronic components;

said fourth group of electronic components having a lower maximum operating temperature than said first, second, and third groups of electronic components;

said second compartment containing a plurality of heat exchanger means for transferring heat from said electronic components to said outside air, said plurality of heat exchanger means comprising a first heat exchanger means, a second heat exchanger means, a third heat exchanger means, and a fifth heat exchanger means;

said second compartment having a bottom opening and a top opening to provide for movement of outside air causing a chimney effect within said second compartment, said outside air entering said second compartment through said bottom opening, contacting and cooling said plurality of heat exchanger means and exiting said second compartment through said top opening;

said panel comprising a first, second, and third conductive heat transferring means for transferring heat from said electronic components and a fourth conductive heat transferring means for transferring heat from a fourth heat exchanger means contained in said first compartment to said plurality of heat exchanger means contained in said second compartment, said first, second, third, and fourth conductive heat transferring means each having a first side and a second side;

said first group of electronic components being connected to a first heat distribution plate, said first heat distribution plate being connected to said first side of said first conductive heat transferring means and said first heat exchanger means being connected to said second side of said first conductive heat transferring means opposite said first group of electronic components, said second group of electronic components being connected to a second heat distribution plate, said second heat distribution plate being connected to said first side of said second conductive heat transferring means and said second heat exchanger means being connected to said second side of said second conductive heat transferring means opposite said second group of electronic components, said third group of electronic components being connected to a third heat distribution plate, said third distribution plate being connected to said first side of said third conductive heat transferring means and said third heat exchanger means being connected to said second side of said third conductive heat transferring means opposite said third group of electronic components;

said first conductive heat transferring means being adjacent to and above said second conductive heat transferring means, said second conductive heat transferring means being insulated by an insulating material from said first conductive heat transferring means having said first group of electronic components being connected thereto, said second conductive heat transferring means being adjacent to and above said third conductive heat transferring means, said third conductive heat transferring means being insulated by an insulating material from said second conductive heat transferring means having said second group of electronic components being connected thereto, said third conductive heat transferring means being adjacent to and above said fourth conductive heat transferring means, said fourth conductive heat transferring means being insulated by an insulating material from said third conductive heat transferring means having said third group of electronic components being connected thereto; and said first compartment containing an air moving means for removing convective heat generated by said groups of electronic components, said air moving means being adapted to conveying air by recycling said air within said first compartment by contacting said air to said fourth heat exchanger means connected to said first side of said fourth conductive heat transferring means, cooling said air, conveying said air after contacting said fourth heat exchanger means to said fourth group of electronic components, to said first group of electronic components, to said second group of electronic components, to said third group of electronic components, and back to said air moving means.

16. A compact electronic housing for a satellite earth station in accordance with claim 15 wherein said panel comprises a metal panel having horizontal slots separating said first conductive heat transferring means from said second conductive heat transferring means from said third conductive heat transferring means from said fourth conductive heat transferring means.

17. A compact electronic housing for a satellite earth station in accordance with claim 15 wherein said insulating material is a solid material having a high thermal resistance, providing an effective environmental seal between said first compartment and said second compartment, and being incorporated in slots contained in said panel.

18. A compact electronic housing for a satellite earth station in accordance with claim 15 wherein said insulating material is a silicone sealant.

19. A compact electronic housing for a satellite earth station in accordance with claim 15 wherein said air moving means comprises an electric fan, horizontal ductwork, vertical ductwork, and a deflector.

20. A compact electronic housing for a satellite earth station in accordance with claim 15 wherein said insulating material has screening material embedded therein.

21. A compact electronic housing for a satellite earth station in accordance with claim 15 wherein said electronic housing is made from structural material, such as aluminum, copper or steel which can withstand outside environment encountered in jungles, deserts, and mountain peaks.

22. A compact electronic housing for a satellite earth station in accordance with claim 15 wherein said electronic housing has an environmental operational range from $-20°$ C. to $+50°$ C., up to an altitude of 10,000 feet, and a relative humidity from 0 to 100%.

23. A compact electronic housing for a satellite earth station in accordance with claim 15 wherein said plurality of heat exchanger means comprise heat exchangers having air cooling fins.

24. A compact electronic housing for a satellite earth station in accordance with claim 15 wherein said first group of electronic components have a maximum allowable base plate temperature of 105° C. and a maximum heat load of 1000 W.

25. A compact electronic housing for a satellite earth station in accordance with claim 15 wherein said second group of electronic components have a maximum allowable base plate temperature of 75° C. and a maximum heat load of 500 W.

26. A compact electronic housing for a satellite earth station in accordance with claim 15 wherein said third group of electronic components have a maximum allowable base plate temperature of 65° C. and a maximum heat load of 250 W.

27. A compact electronic housing for a satellite earth station in accordance with claim 15 wherein said electronic housing comprises a compact electronic housing having overall dimensions of approximately $4' \times 5' \times 1\frac{1}{2}'$.

28. A compact electronic housing for a satellite earth station in accordance with claim 15 wherein said first compartment has dimensions of approximately $4' \times 5' \times 13''$.

* * * * *